US006952949B2

United States Patent
Moore et al.

(10) Patent No.: US 6,952,949 B2
(45) Date of Patent: Oct. 11, 2005

(54) ARRANGEMENT FOR COUPLING MICROWAVE ENERGY INTO A TREATMENT CHAMBER

(75) Inventors: Rodney Moore, Gardener, MA (US); Wolf Essers, Weiterstadt (DE)

(73) Assignee: Tetra Laval Holdings & Finance S.A. (CH)

( * ) Notice: Subject to any disclaimer, the term of this patent is extended or adjusted under 35 U.S.C. 154(b) by 349 days.

(21) Appl. No.: 10/169,698

(22) PCT Filed: Dec. 15, 2000

(86) PCT No.: PCT/EP00/12770

§ 371 (c)(1),
(2), (4) Date: Oct. 23, 2002

(87) PCT Pub. No.: WO01/48788

PCT Pub. Date: Jul. 5, 2001

(65) Prior Publication Data

US 2003/0097986 A1 May 29, 2003

(30) Foreign Application Priority Data

Dec. 24, 1999 (DE) .......................................... 199 63 122

(51) Int. Cl.[7] .......................... B01D 47/16; F02M 17/28; F02M 29/04; G01N 15/08
(52) U.S. Cl. ..................... 73/38; 261/97; 118/723 MW
(58) Field of Search .......................... 455/446; 118/337, 118/723, 317; 73/38; 261/97; 291/121.43, 121.42, 696, 750, 97

(56) References Cited

U.S. PATENT DOCUMENTS

| 5,153,406 | A | | 10/1992 | Smith |
| 2003/0051666 | A1 | * | 3/2003 | Moore et al. ........ 118/723 MW |
| 2003/0094711 | A1 | * | 5/2003 | Moore et al. ................. 261/97 |
| 2004/0177676 | A1 | * | 9/2004 | Moore ........................... 73/38 |

* cited by examiner

*Primary Examiner*—William D. Cumming
(74) *Attorney, Agent, or Firm*—Michael L. Dunn

(57) ABSTRACT

An arrangement for coupling microwave energy into a plasma CVD coating chamber (3) disposed in a cavity resonator (1) has a microwave feed (11) and a microwave waveguide (9, 1). So that a plastic container of a size and configuration which differ to a certain degree can be effectively coated in its interior, it is provided that the arrangement is of a substantially cylindrical structure, such that provided at the rear end is a first coaxial waveguide (in the region a) with an internal conductor in the form of an antenna (12), an approximately cylindrical waveguide (in the region b) follows in the centre of the arrangement and provided at the front end (in the region c) is a second coaxial waveguide (1) with internal conductor (13), wherein gas can be introduced through a gas feed tube (13) into the second coaxial waveguide (in the region c), which gas can be activated into the plasma state by the coupled-in microwave energy, and wherein a TM-mode is produced by the antenna (12) in the plasma region (1, c).

16 Claims, 4 Drawing Sheets

ARRANGEMENT FOR COUPLING MICROWAVE ENERGY INTO A TREATMENT CHAMBER

BACKGROUND OF THE INVENTION

The invention concerns an arrangement for coupling microwave energy into a treatment chamber disposed in a cavity resonator, in particular a plasma CVD coating chamber, comprising a microwave feed and a microwave waveguide.

Apparatuses are known for producing a plasma which serves for example for coating, cleaning, modifying and etching substrates, but also for treating medical implants. Workpieces of the most widely varying shapes are coated. Known apparatuses for producing plasma have an annular resonator to which microwaves are fed by way of a waveguide and a coaxial cable.

The coating of motor vehicle tanks is also known, in which case four or more microwave sources in the form of magnetrons are arranged in the outside wall of the cavity resonator, in order to activate a gas which has been previously introduced into the tank, to the plasma state, by means of the coupled-in microwave energy. At least four magnetrons are required for a tank and, if a plurality of containers are to be simultaneously provided with an internal coating, the number of magnetrons with their power supply units increases to an economically non-viably high number. In addition it has been found that, depending on the respective size and configuration of the container to be coated, the losses and reflections of the coupled-in microwave energy differ to such an extent that, for a given configuration, it is necessary to implement an adaptation procedure which then no longer affords satisfactory results for the next, different configuration. Different loads, losses and reflection phenomena occur so that a more or less tedious adaptation and tuning procedure has to be implemented for each kind of container. Investigations have also already been conducted into the reflection factor of the microwave power in dependence on the length of the feed conduit to a microwave reaction chamber in order to achieve optimum tuning for given frequencies. A change in the pattern of the reflection effect in dependence on the length of a feed conduit has been achieved by introducing different absorbers into microwave waveguides, but in that case a sensitivity in regard to mismatching as a consequence of changes in geometry is always to be observed.

BRIEF SUMMARY OF THE INVENTION

The object of the present invention is to design an arrangement for coupling in microwave energy, of the kind set forth in the opening part of this specification, such that plastic containers of a size and configuration which differ to a certain degree can be internally effectively coated. In other words slight variations in size and each different configuration of containers do not involve the provision of a different coupling-in arrangement or at least an adaptation and matching procedure which requires conversion work.

For a magnetron which produces microwave energy at a fixed frequency the reflection factor of the power should not drop too sharply in dependence on the effective length of the waveguide which is a function of the container dimensions, in order to rise correspondingly sharply again beside the minimum value, but the behaviour of that curve should exhibit a uniform effect.

Surprisingly, in accordance with the invention the object stated is attained in that the arrangement is of a substantially cylindrical structure, such that provided at the rear end is a first coaxial waveguide with an internal conductor in the form of an antenna, an approximately cylindrical waveguide follows in the centre of the arrangement and provided at the front end is a second coaxial waveguide with internal conductor, wherein gas can be introduced through a gas feed tube into the second coaxial waveguide, which gas can be activated into the plasma state by the coupled-in microwave energy, and wherein a TM-mode is produced by the antenna in the plasma region. Those measures afford a somewhat more moderate reflection factor drop in power in dependence on the geometry of the container, with the consequence that even containers of unequal volumes and different configurations can nonetheless always still be effectively treated because sufficient microwave power is available for firing and maintaining the plasma, that is to say the reflected power is low. A need for complete fresh adaptation occurs only when the volume of the treated containers changes by a factor of two or more and in a corresponding fashion the configuration of the one container is also altered in a highly drastic manner with respect to the other. The measures according to the invention provide that different containers of similar shape and size can be treated with an adequate level of efficiency, without involving conversion work.

It is not only the substantially cylindrical form of the cavity resonator but also the avoidance of mismatching effects that contribute to the good treatment results and coupling-in of the microwave power with a good degree of efficiency also succeeds due to the successive arrangement of the three electrically different waveguide portions, wherein the first waveguide is a coaxial conductor, the second is a cylindrical waveguide (at the centre) and the front conductor is again a second coaxial waveguide. The great advantage of the arrangement of those three portions is also the possibility of separating or sealing off the one portion with respect to the other. In addition, the separation of those portions which differ in terms of function afforded a particular degree of effectiveness in regard to coupling in the microwave power.

DETAILED DESCRIPTION OF THE INVENTION

Figure 1:
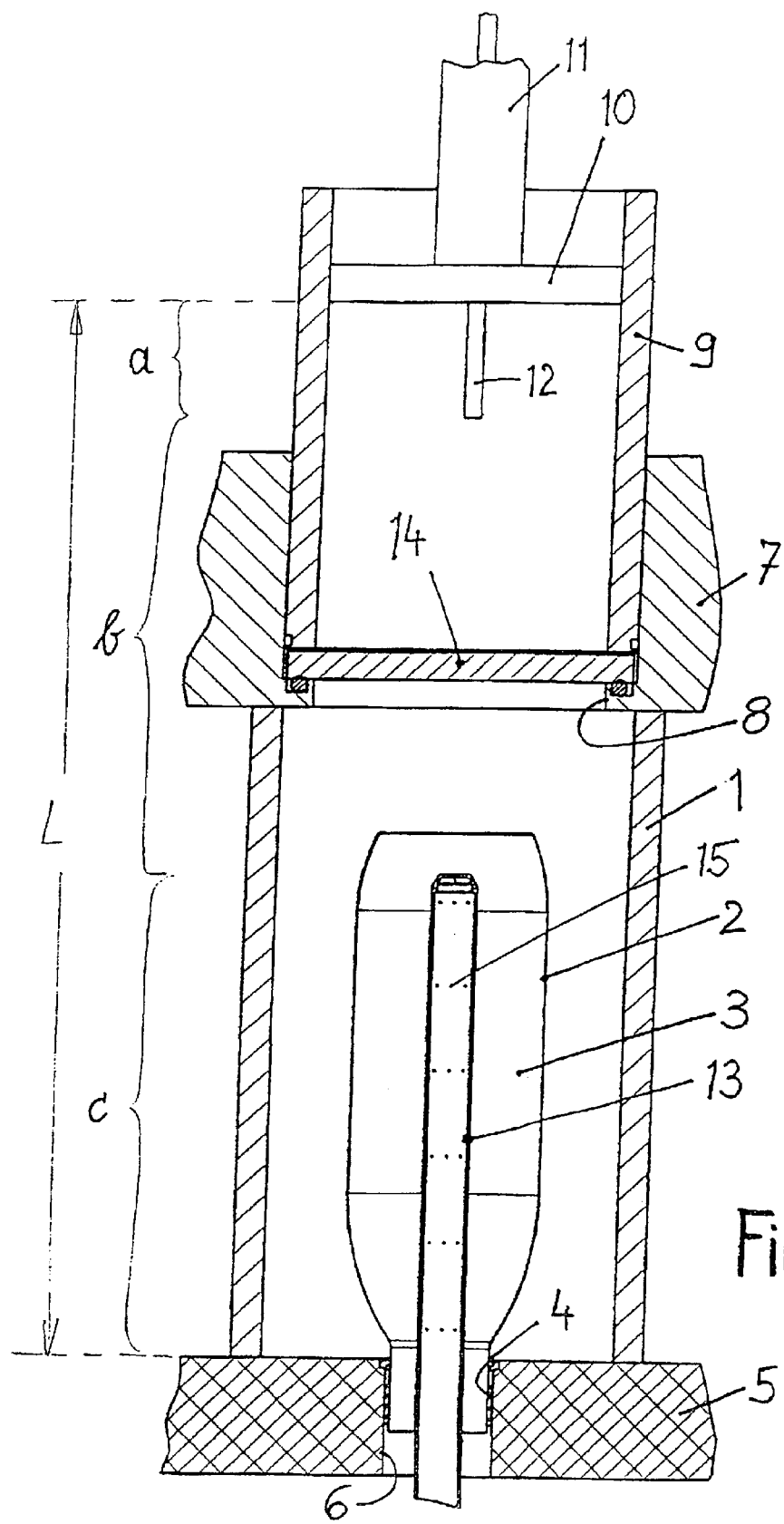
FIG. 1 is a partly broken-away diagrammatic view in cross-section through a coupling-in arrangement according to a first embodiment of the invention.

It is particularly advantageous in accordance with the invention if the antenna of the first coaxial waveguide is of a bar shape and the length of the bar antenna is between 40 mm and 100 mm. With such a bar antenna (equally well as with the other embodiments of the antennae which are described hereinafter) it is possible to achieve a TM-mode, that is to say transverse magnetic field lines in the three portions of the arrangement, while the production of the TM-mode is possible in particular in the plasma region. The arrangement according to the invention also works well with a bar antenna whose length is between 50 and 60 mm. The bar antenna can be made from copper and can be about 8 mm in outside diameter. However outside diameters from the range of sizes of between 2 mm and 10 mm also function well.

It is further desirable in accordance with the invention if, in accordance with an alternative embodiment, the antenna of the first coaxial waveguide is in the form of a conical spiral and the length of the spiral antenna is between 50 and 70 mm. The so-called Archimedes' spiral is known. It is represented in polar co-ordinates by the equation $r = a \times \Phi$. The conical spiral corresponds in space to that Archimedes' spiral. It is the trajectory of a point which moves at a constant speed on a surface line rotating at a constant angular speed about a cone axis. The spiral antenna should desirably also be made from copper, with a diameter of particularly preferably about 3.5 mm. Spiral antennae with six turns have proven to be highly desirable. They were about 60 mm in length. However, tests with spiral antennae of a length of between 50 and 70 mm and with between 5 and 7 turns also operated satisfactorily. A range of between 2 and 5 mm can be specified as the diameter range. If the frustoconical shape of the spiral antenna is considered, then the large diameter is at the so-called rear or downstream end, that is to say remote from the gas feed tube, while the end with the small diameter is towards the end of the gas feed tube. The larger rear diameter is in the range of sizes of between 35 and 50 mm and is preferably 42 mm. The smaller diameter at the front on the spiral is in the range of between 15 and 30 mm and in the preferred embodiment is about 22 mm.

Instead of a spiral antenna in the form of a hollow truncated cone however it is also possible, as viewed from the outside, to imagine a stepped shape with a diameter in respect of the rear three turns of between 35 and 50 mm and preferably 42 mm. The diameter of the front three turns is then desirably in the range of between 15 and 30 mm and is preferably 22 mm.

Instead of a conical spiral it is also possible to adopt a "cylindrical spiral" in which for example all six turns of the antenna extend on the circumference of a circle of a diameter of between about 35 and 50 mm and preferably 42 mm. Admittedly both the stepped shape and also the cylindrical shape do not involve a conical spiral in the true geometrical sense, but the spiral antenna also functions outside the shapes with the precise geometrical definitions.

Desirably a further configuration of the invention provides that the internal conductor of the second coaxial waveguide is in the form of a gas feed tube and is made from metal which is surrounded by the plastic container to be coated, and that the container which is held in the container carrier plate forms the treatment chamber. This embodiment of the coupling-in arrangement is particularly useful in a procedure for the internal coating of plastic containers by means of plasma. The plasma is formed (inter alia) by a gas which is introduced and which passes rapidly and effectively by way of the described feed tube into the interior of the container. The gas feed tube of metal represents the internal conductor of the second coaxial waveguide at the front end of the arrangement. The gas feed tube projects into the container to be coated, for example a plastic bottle of PET, by which the gas feed tube is surrounded. In that way the container forms the actual treatment chamber. Suitable conduits permit a desired reduced pressure to be set in the treatment chamber, that is to say in the containers to be coated. Different pressures may be provided outside the treatment chamber but still within the cavity resonator.

If those different pressures are in turn pressures which are lower than atmospheric pressure, namely reduced pressures or partial vacuums, it is desirable, if in accordance with the invention in a further configuration disposed in the cylindrical waveguide which is at the centre of the arrangement is a quartz window which extends transversely with respect to the longitudinal axis of the arrangement. That longitudinal axis extends approximately in a line from the gas feed tube to the antenna or vice-versa and the quartz window is a plate through which microwaves can pass like a window. The quartz plate permits a gas-tight separation to be afforded between the one waveguide and the other and also permits a waveguide portion to be separated into two different regions. In that way it is possible to evacuate the one region, for example the region of the second coaxial waveguide, and to keep the region with the antenna under atmospheric pressure.

It has also proven to be desirable if the spiral antenna is releasably fixed by means of frictional engagement in a sleeve-shaped receiving means or mounting. Tests have shown that a solder join which is normally considered to be good is unsuitable for optimum coupling-in of the microwave energy. On the contrary it is advisable if the rear end of the spiral antenna, which end extends in the direction of the longitudinal axis of the arrangement, is fitted in a slightly configuration into a sleeve-shaped receiving means and is clamped fast therein, the receiving means also extending in the direction of the longitudinal axis of the arrangement.

Further advantages, uses and features of the invention will be apparent from the following embodiments in the description hereinafter with reference to the accompanying drawings.

Figure 2:
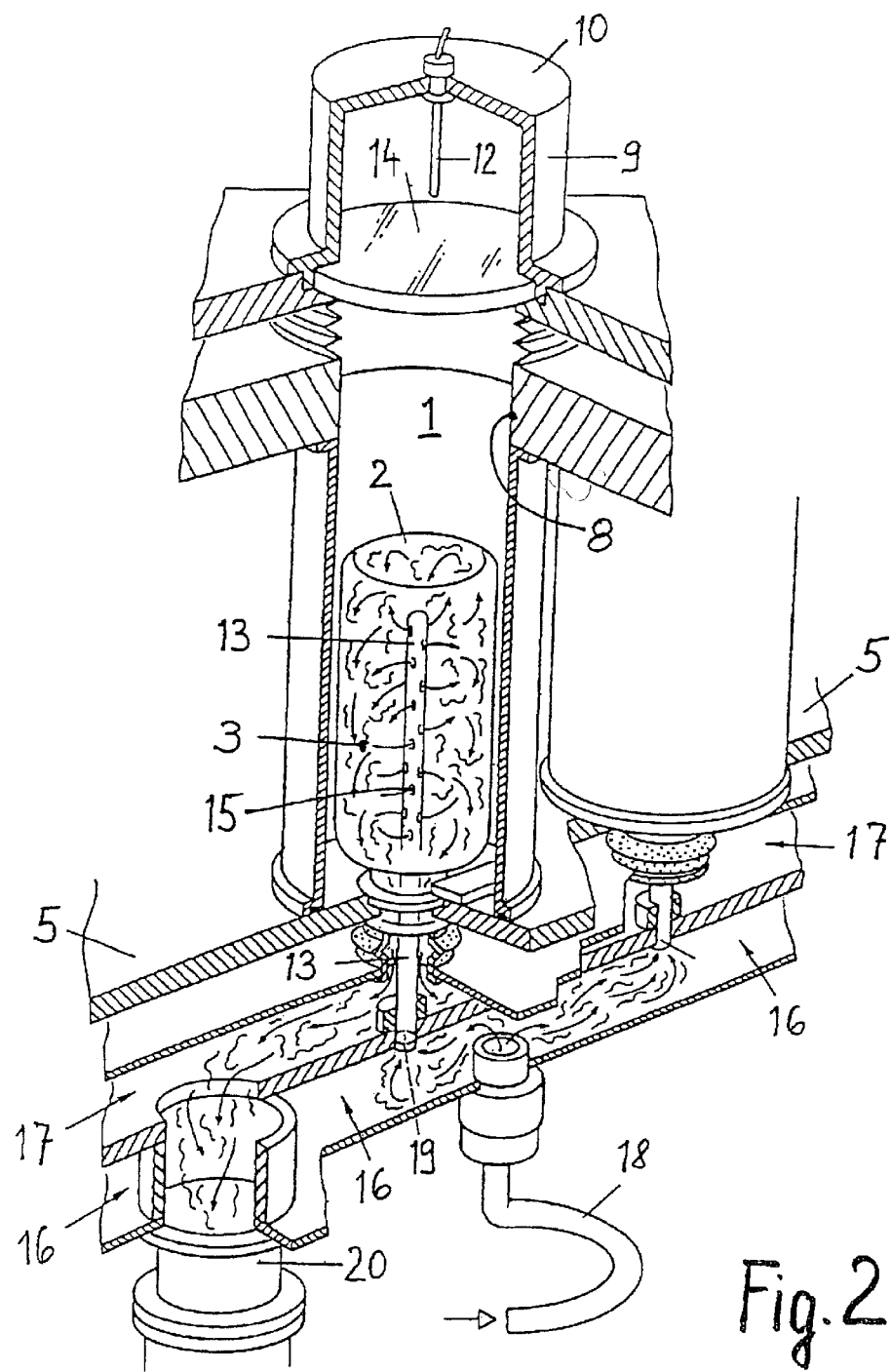
FIG. 2 shows a partly broken-away actual construction with a bar antenna and a plurality of containers which are to be internally coated, arranged in mutually juxtaposed relationship.
Figure 3:
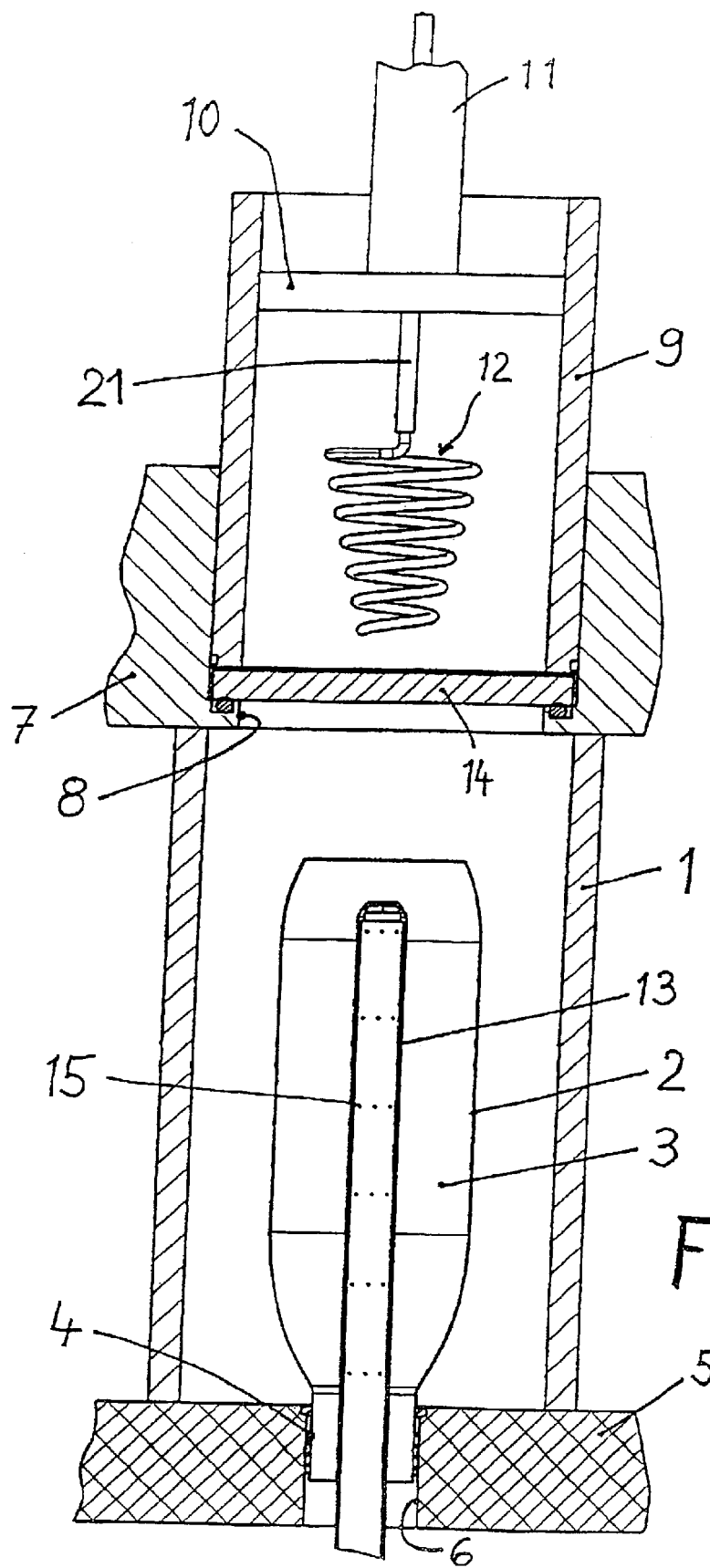
FIG. 3 is a similar view to FIG. 1 but using a spiral antenna.

In FIG. 1 and similarly in FIG. 3 a container 2 in the form of a plastic bottle is disposed in a cavity resonator 1. The container 2 forms the treatment chamber 3 which is therefore disposed in the interior of the container 2. The container 2 is only open at its front lower end, by way of the bottle neck 4. At the top and rear end it is closed, as also at the sides. The container 2 is carried by way of its bottle neck 4 by the container carrier plate 5. If a plurality of units as are shown in the diagrammatic views in FIGS. 1 and 3 are involved, as for example in the case of the structure shown in FIG. 2, then a corresponding number of holes 6 are provided in mutually juxtaposed relationship in the container carrier plate 5 for receiving the bottle necks 4.

A separating wall 7 is secured to the cavity resonator 1 in an upward and rearward direction at a spacing from the container bottom, in a substantially horizontal position. In the direction of the longitudinal axis of the arrangement which is not shown and identified in the Figures but extends from the centre of the hole 6 in the container carrier plate 5 vertically upwardly perpendicularly to the surface of the container carrier plate 5, disposed in the separating wall 7 over each container 2 is a hole 8 for receiving a cylindrical housing 9 which is sealed rearwardly and upwardly by a housing end portion 10.

Figure 4:
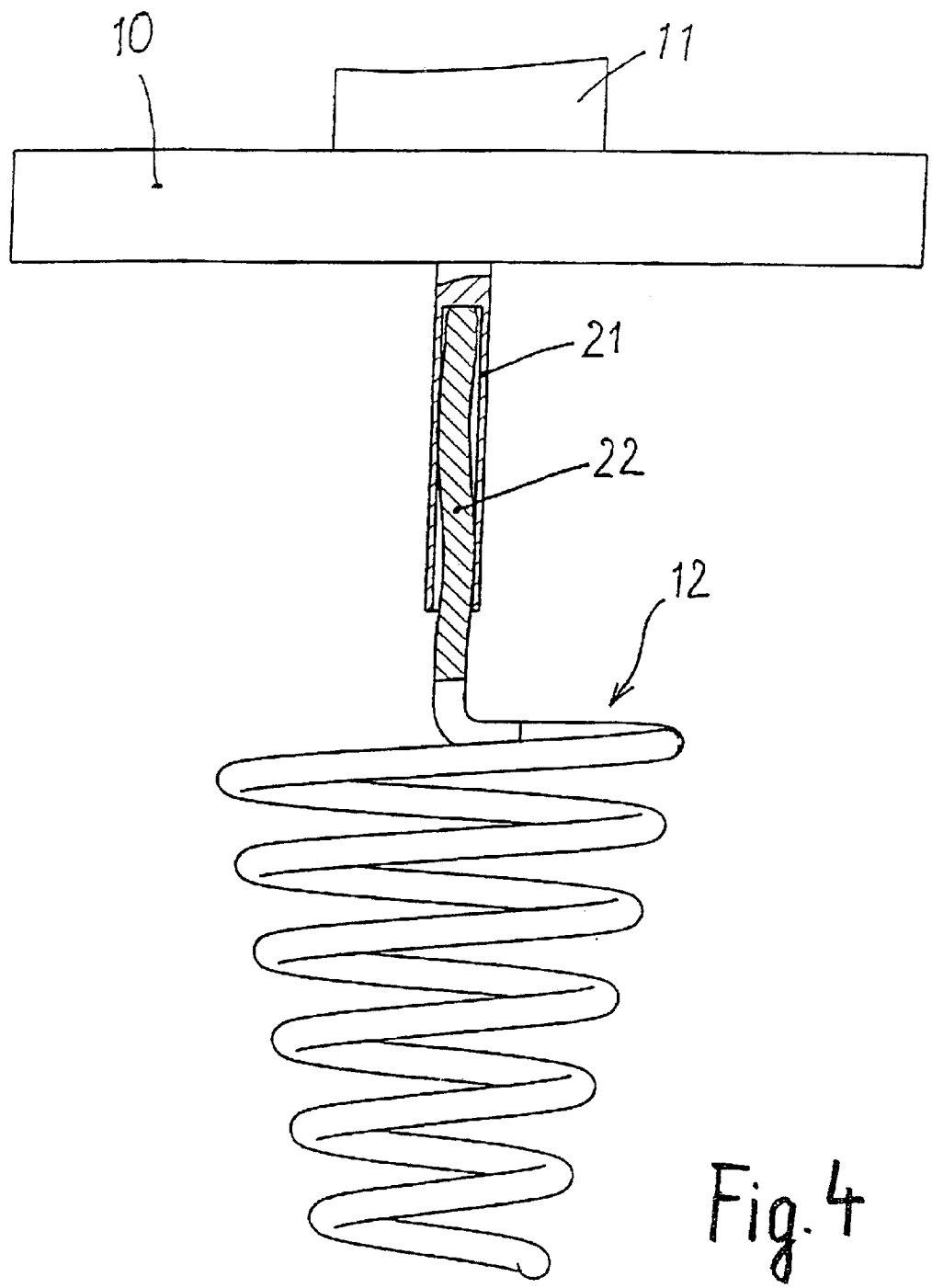
FIG. 4 is a view on an enlarged scale of the spiral antenna with the sleeve-shaped receiving means for same.

Fixed approximately at the centre of the housing end portion 10 is a microwave feed 11 which projects upwardly and rearwardly and also outwardly of the housing 9. The microwave feed 11 is typically a coaxial cable or a coaxial waveguide and feeds an antenna which is identified by reference numeral 12 and which in the embodiments shown in FIGS. 1 and 2 is in the form of a bar and is therefore referred to as a bar antenna. In the embodiment of FIGS. 3 and 4 the antenna 12 is in the form of a conical spiral but it is also identified by reference 12. That antenna provides for coupling the microwave energy into the housing 9, the cavity resonator 1 and into the treatment chamber 3 which in these embodiments is in the form of a coating chamber 3. Overall the space with the waveguides extends from the front rearwardly (upwardly in the Figures) from the internal surface of the container carrier plate 5 to the internal surface of the housing end portion 10. That space which is acted upon by microwaves is of an overall length L. The arrangement of this substantially cylindrical structure is such that, viewed electrically, at the rear end, that is to say at the top in FIGS. 1 to 3, in the region a there is a first coaxial waveguide which has an internal conductor in the form of the antenna 12. It terminates at the front end of the region a. In the centre there then follows an approximately cylindrical waveguide in the region b, which does not have an internal conductor, while provided at the front end (downwardly in the Figures), in the region c, is a second coaxial waveguide. The latter has an internal conductor in the form of a gas feed tube 13.

Secured to the front lower end of the cylindrical housing 9—still arranged in the separating wall 7—is a quartz window 14 through which the space in the cavity resonator 1 can be gas-tightly separated from that in the housing 9 in such a way that the pressure of the gases contained in the housing 9 can be different from in the cavity resonator 1.

A gas mixture can be introduced into the latter through the gas feed tube 13 from the front and below, as indicated by the curved arrows shown at the bottom in FIG. 2.

Without the container 2 the plasma can be produced and activated in the cavity resonator 1 by the action of the microwave energy on the gas mixture and thereafter can possibly be further blown into other spaces or chambers.

In the embodiment illustrated herein however the container 2 is sealingly fitted by way of the neck of its opening in the container carrier plate in such a way that the gas for plasma formation, after issuing from the holes 15, remains entirely within the volume of the container 2, as indicated in FIG. 2. The so-called plasma region is then substantially within the front lower region c in the cavity resonator 1.

Irrespective of the physical configuration of the cylindrical housing 9 on the one hand which is then followed in a forward and downward direction by the cavity resonator 1 on the other hand, the length of the first coaxial waveguide disposed at the rear end (in the region a) is defined by the length of the antenna 12. In the region b where the cylindrical waveguide does not have an internal conductor, the substantially cylindrical space, even if it is formed by different housing portions which can possibly be of different diameters, is determined by the spacing of the antenna 12 on the one hand and the free inner end of the gas feed tube 13 on the other hand. Finally, at the front end, in the region c, the second coaxial waveguide is determined by the length of its internal conductor, that is to say by the length of the gas feed tube 13. Its length is measured from the internal surface of the container carrier plate 5 to the upper, rear, inner end of the gas feed tube 13.

The bar antenna shown in FIGS. 1 and 2 is 55 mm in length and comprises a copper wire of an outside diameter of 8 mm.

The embodiment of FIG. 2 shows coupling-in arrangements for treating a plurality of plastic bottles. The right-hand arrangement can only be seen from the exterior while the left-hand arrangement is shown in section. In each unit, the microwaves are coupled into the cavity resonator 1 by the antenna 12 by way of the housing 9. The antenna 12 extends along the longitudinal centre line which extends through the entire arrangement from the front rearwardly, that is to say upwardly in FIG. 2. The antenna 12 is disposed in the housing 9 outside the vacuum chamber which is notionally to be considered arranged around the cylinder of the cavity resonator 1. The quartz window 14 closes off the cavity resonator 1 in the upward direction while the container carrier plate 5 forms the closure means in the forward and downward direction.

For feeding process gas to the plastic bottles to be coated and for evacuation thereof, there are two chambers or spaces which are disposed in mutually superposed relationship and which extend over the entire area of a matrix or a row of bottle apparatuses of which two items are shown in FIG. 2. For the purposes of positioning the gas feed tube 13, for connection of the containers 2 in bottle form to process gas and vacuum and for closure of the cavity resonator 1, the containers which are positioned on the common container carrier plate 5 are moved relative to a double chamber or space 16/17. The gas feed tube 13 of each unit is connected to the lower plenum or space 16, the gas space. Process gas is fed into same through at least one gas feed conduit 18. At the intake side each gas feed tube 13 has a throttle 19 which is in the form of a control flap or aperture and by which the flow of process gas into the container 2 can be adjusted.

The neck of each bottle 2 to be treated (container 2) is connected to the upper plenum 17, a vacuum space. It is evacuated by way of a vacuum conduit 20 in order to produce and also maintain a reduced pressure in the respective container 2.

After the plasma treatment the container carrier plate 5 with the containers 2 and the double space 16/17 (lower plenum 16 and upper plenum 17) are separated from each other and the containers 2 in bottle form can then be removed.

The second embodiment shown in FIG. 3 is identical to all the parts and structures of the embodiment of FIG. 1, with one exception. The exception is the configuration of the antenna 12. As shown in FIGS. 3 and 4 it is in the form of a conical spiral. Secured to the container end portion 10 is a sleeve-shaped receiving means or mounting 21 which projects into the space in the housing 9 and in which the rear upper end 22 of the spiral 12 is fixed by frictional engagement. FIG. 4 shows how that upper end 22 of the spiral antenna 12 is curved so as to permit frictional engagement in the receiving means 21 although the outside diameter of the upper end 22 of the spiral antenna 12 is smaller than the inside diameter of the blind bore in the receiving means 21.

In a particularly preferred embodiment of the invention of the spiral antenna 12 the spacing between the front lower surface of the housing end portion 10 on the one hand and the uppermost first turn of the spiral antenna 12 on the other hand is 50 mm. The diameter of the uppermost rear largest turn is also 50 mm while the length of the spiral antenna 12 in the direction of the longitudinal axis of the entire arrangement is 60 mm. The diameter of the smallest turn at the foremost lowermost end of the spiral antenna 12 is 22 mm.

Reference numbers referred to above are as follows:
1 cavity resonator
2 container
3 treatment chamber
4 neck of the container
5 container carrier plate
6 hole in the container carrier plate
7 separating wall
8 hole in the separating wall
9 cylindrical housing
10 housing end portion
11 microwave feed 12 antenna
13 gas feed tube
14 quartz window
15 holes in the gas feed tube
16/17 double space
16 lower plenum
17 upper plenum
18 gas feed conduit
19 throttle
20 vacuum conduit
21 receiving means
22 upper end of the spiral antenna

What is claimed is:

1. An apparatus for coupling microwave energy into a plasma chemical vapor deposition (CVD) coating chamber (3), said apparatus comprising a cavity resonator for containing the coating chamber (3), a microwave feed (11) and microwave waveguides wherein the apparatus further has a substantially cylindrical shape and is provided at one end region (a) with a first coaxial waveguide having an internal conductor in the form of an antenna (12), at a central region (b) with an approximately cylindrical waveguide and at a second end region (c) with a second coaxial waveguide (1) having an internal conductor and a gas feed tube (13) through which gas can be provided into the coating chamber to be activated into a plasma state by coupled microwave energy having a transverse magnetic field line (TM)mode within the second end region (c), produced by the antenna (12).

2. An apparatus according to claim 1 wherein the antenna (12) of the first coaxial waveguide (in the region a) is in bar form and the length of the bar antenna (12) is between 40 mm and 100 mm.

3. An apparatus according to claim 1 wherein the antenna (12) of the first coaxial waveguide (in the region a) is in the form of a conical spiral and the length of the spiral antenna (12) is between 50 mm and 70 mm.

4. An apparatus according to claim 1 wherein the internal conductor of the second coaxial conductor (in the region c) is in the form of the gas feed tube (13) and is made from metal which is surrounded by a plastic container (2) to be coated, and the container (2) is carried in a container carrier plate (5) to form the coating chamber (3).

5. An apparatus according to claim 2 wherein the internal conductor of the second coaxial conductor (in the region c) is in the form of the gas feed tube (13) and is made from metal which is surrounded by a plastic container (2) to be coated, and the container (2) is carried in a container carrier plate (5) to form the coating chamber (3).

6. An apparatus according to claim 3 wherein the internal conductor of the second coaxial conductor (in the region c) is in the form of the gas feed tube (13) and is made from metal which is surrounded by a plastic container (2) to be coated, and the container (2) is carried in a container carrier plate (5) to form the coating chamber (3).

7. An apparatus according to claim 1 wherein a quartz window (14) is disposed in the cylindrical waveguide which extends transversely with respect to a longitudinal axis of the apparatus.

8. An apparatus according to claim 2 wherein a quartz window (14) is disposed in the cylindrical waveguide which extends transversely with respect to a longitudinal axis of the apparatus.

9. An apparatus according to claim 3 wherein a quartz window (14) is disposed in the cylindrical waveguide which extends transversely with respect to a longitudinal axis of the apparatus.

10. An apparatus according to claim 4 wherein a quartz window (14) is disposed in the cylindrical waveguide which extends transversely with respect to a longitudinal axis of the apparatus.

11. An apparatus according to claim 5 wherein a quartz window (14) is disposed in the cylindrical waveguide which extends transversely with respect to a longitudinal axis of the apparatus.

12. An apparatus according to claim 6 wherein a quartz window (14) is disposed in the cylindrical waveguide which extends transversely with respect to a longitudinal axis of the apparatus.

13. An apparatus according to claim 3 wherein the spiral antenna (12) is fixed releasably by means of frictional engagement in a sleeve-shaped receiving means (21).

14. An apparatus according to claim 6 wherein the spiral antenna (12) is fixed releasably by means of frictional engagement in a sleeve-shaped receiving means (21).

15. An apparatus according to claim 9 wherein the spiral antenna (12) is fixed releasably by means of frictional engagement in a sleeve-shaped receiving means (21).

16. An apparatus according to claim 12 wherein the spiral antenna (12) is fixed releasably by means of frictional engagement in a sleeve-shaped receiving means (21).

* * * * *